(12) United States Patent
Elias

(10) Patent No.: US 8,860,455 B2
(45) Date of Patent: Oct. 14, 2014

(54) METHODS AND SYSTEMS TO MEASURE A SIGNAL ON AN INTEGRATED CIRCUIT DIE

(75) Inventor: Vinu K. Elias, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 734 days.

(21) Appl. No.: 12/978,456

(22) Filed: Dec. 24, 2010

(65) Prior Publication Data

US 2012/0161808 A1 Jun. 28, 2012

(51) Int. Cl.
*G01R 31/02* (2006.01)
*G01R 31/28* (2006.01)

(52) U.S. Cl.
CPC .................................. *G01R 31/2884* (2013.01)
USPC .............. 324/762.03; 324/750.3; 324/762.02; 324/73.1; 324/76.11; 361/56; 361/93.2; 361/93.1

(58) Field of Classification Search
CPC .............. G01R 31/26; G01R 31/2884; G01R 31/3187; G01R 31/31717; G01R 31/28; G01R 31/2853; G01R 31/31701; G01R 31/31924; G01R 31/3008; G01R 31/3004; H01L 27/0277; H03K 19/00315; H03K 19/17744; H03K 19/1778; H03K 17/0822
USPC ................... 324/762.03, 750.3, 762.02, 73.1; 361/56, 93.2, 93.1
See application file for complete search history.

(56) References Cited

U.S. PATENT DOCUMENTS

| 5,016,072 | A | * | 5/1991 | Greiff | 257/418 |
| 5,371,457 | A | * | 12/1994 | Lipp | 324/762.02 |
| 6,034,857 | A | * | 3/2000 | Sample et al. | 361/93.2 |
| 6,259,588 | B1 | * | 7/2001 | Sample et al. | 361/93.2 |
| 6,339,388 | B1 | * | 1/2002 | Matsumoto | 341/120 |
| 6,351,134 | B2 | * | 2/2002 | Leas et al. | 324/750.05 |
| 6,876,218 | B1 | * | 4/2005 | Simmons et al. | 324/750.3 |
| 7,019,581 | B1 | * | 3/2006 | Potanin et al. | 327/427 |
| 7,369,385 | B2 | * | 5/2008 | Brennan et al. | 361/93.1 |
| 7,446,549 | B2 | * | 11/2008 | Tomita et al. | 324/750.3 |
| 7,952,371 | B2 | * | 5/2011 | Nagasawa | 324/750.3 |
| 8,295,018 | B2 | * | 10/2012 | Hsieh et al. | 361/56 |
| 2002/0093366 | A1 | * | 7/2002 | Fotouhi | 327/108 |
| 2003/0208708 | A1 | * | 11/2003 | Sunter | 714/727 |
| 2005/0116749 | A1 | * | 6/2005 | Pentakota et al. | 327/131 |
| 2005/0259471 | A1 | * | 11/2005 | Kuo | 365/185.21 |
| 2006/0132165 | A1 | * | 6/2006 | Walker et al. | 324/765 |
| 2006/0220669 | A1 | * | 10/2006 | Saitou et al. | 324/765 |
| 2006/0247873 | A1 | * | 11/2006 | Fung et al. | 702/64 |
| 2007/0268642 | A1 | * | 11/2007 | Metayer et al. | 361/93.1 |

(Continued)

*Primary Examiner* — Tung X Nguyen
*Assistant Examiner* — Thang Le
(74) *Attorney, Agent, or Firm* — Garrett IP, LLC

(57) ABSTRACT

Methods and systems to measure a signal on an integrated circuit die. An on-die measurement circuit may measure an on-die signal relative to an off-die generated reference signal, which may include a series of increasing voltage steps. The on-die measurement circuit may continuously compare voltages of the on-die signal and the off-die generated reference signal, and may generate an indication when the off-die reference signal exceeds the on-die signal. The measurement circuit may generate the indication from a voltage source other than the on-die signal to be measured, and/or may generate the indication with a relatively large voltage swing. The indication may be output off-die for evaluation, such as for testing, debugging, characterization, and/or operational monitoring. A unity gain analog buffer may be provided to tap the on-die signal proximate to a node of interest, which may be implemented within the on-die measurement circuit.

18 Claims, 6 Drawing Sheets

(56) References Cited

U.S. PATENT DOCUMENTS

| | | | |
|---|---|---|---|
| 2008/0061883 A1* | 3/2008 | Kataria | 330/289 |
| 2008/0147340 A1* | 6/2008 | Gebara et al. | 702/69 |
| 2008/0150553 A1* | 6/2008 | Yakabe | 324/686 |
| 2008/0158037 A1* | 7/2008 | Hsien et al. | 341/164 |
| 2009/0115458 A1* | 5/2009 | Carr et al. | 326/122 |
| 2009/0140248 A1* | 6/2009 | Ma | 257/48 |
| 2009/0167094 A1* | 7/2009 | Tseng et al. | 307/80 |
| 2011/0001503 A1* | 1/2011 | Antley et al. | 324/750.3 |
| 2011/0115509 A1* | 5/2011 | Kim et al. | 324/750.3 |
| 2011/0199159 A1* | 8/2011 | Rozen et al. | 331/74 |

* cited by examiner

US 8,860,455 B2

METHODS AND SYSTEMS TO MEASURE A SIGNAL ON AN INTEGRATED CIRCUIT DIE

BACKGROUND

Automated and semi-automated techniques have been developed to test integrated circuits (ICs). Causes of faults or errors encountered during testing are, however, notoriously difficult to trace.

For example, an IC may receive an analog system reference voltage, and may include one or more voltage dividers to generate one or more additional analog voltages from the system reference voltage. Other circuitry within the IC may utilize one or more of the analog voltages as reference voltages, bandgap reference voltages, and/or bias voltages. An analog voltage may encounter a voltage or IR drop due to distance from a driver or buffer circuit, loading effects of associated circuitry, and/or fabrication variations that may affect characteristics of the die itself. An IR drop may impact operation of the IC in one or more of a variety of ways, including slowed response times and loss of functionality, which may be detected as an error or fault during testing of the IC.

To trace or debug the source of the error or fault, on-die analog signals may be measured with an off-die measurement device, such as an oscilloscope or volt meter. Conventionally, multiple on-die signals are multiplexed to one or more off-die accessible pads through analog multiplexers, often through relatively long and circuitous signal routes, which may itself introduce IR drops, capacitive loads, and/or other effects, and which may mask true states of the on-die signals.

BRIEF DESCRIPTION OF THE DRAWINGS/FIGURES

Figure 1:
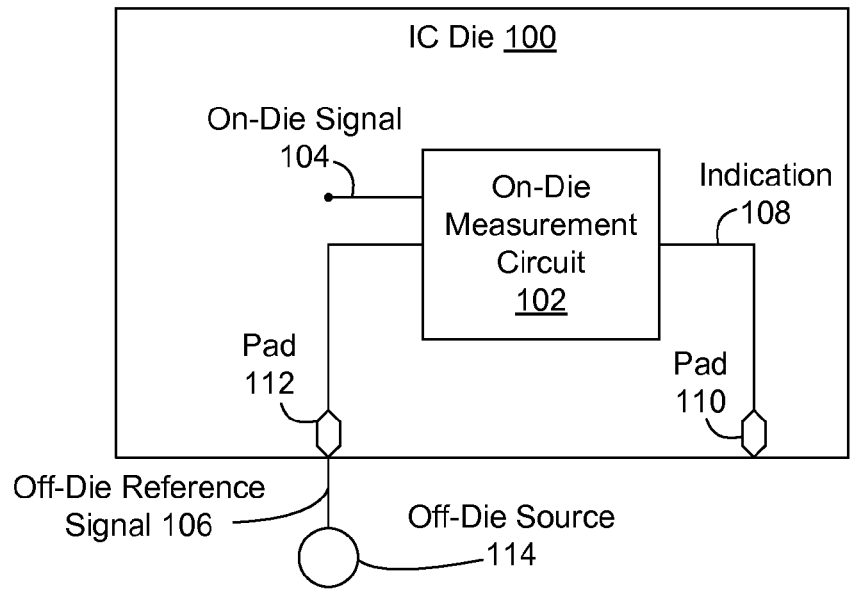
FIG. 1 is a block diagram of an integrated circuit die, including an on-die measurement circuit to measure an on-die signal relative to an off-die generated reference signal.

In the drawings, the leftmost digit(s) of a reference number identifies the drawing in which the reference number first appears.

DETAILED DESCRIPTION

Disclosed herein are methods and systems to measure a signal on an integrated circuit die and to output an indication of the measure from the die.

FIG. 1 is a block diagram of an integrated circuit die 100, including an on-die measurement circuit 102 to measure an on-die signal 104 relative to an off-die generated reference signal 106, and to output an indication 108 of the measurement to an off-die accessible, electrically conductive pad 110.

Die 100 may include an externally accessible electrically conductive pad 112 to receive reference signal 106 from an off-die signal source 114.

Indication 108 may be monitored at off-die at pad 110 with electronic monitoring and/or test equipment, which may include one or more of an oscilloscope, a voltage sensor/meter, a current sensor/meter, and/or a test set.

On-die measurement circuit 102 may be utilized during testing and debugging of die 100. Alternatively, or additionally, measurement circuit 102 may be utilized during operation of die 100 to monitor performance.

On-die measurement circuit 102 may be configured to measure a voltage level of on-die signal 104 relative to a voltage level of off-die reference signal 106. On-die measurement circuit 102 is not, however, limited to measuring voltage.

On-die measurement circuit 102 may be configured to generate indication 108 as an indication of whether a measure of on-die signal 104 is less-than or greater-than a measure of off-die reference signal 106, such as disclosed below with reference to FIG. 2.

On-die implementation of measurement circuit 102 may help to protect on-die signal 104 from IR loading and/or capacitive effects that may otherwise be introduced by off-die measurement techniques.

On-die implementation of measurement circuit 102 may avoid buffers and/or driver circuits that may otherwise be used to drive on-die signal 104 to an externally accessible pad for off-die measurement.

On-die signal 104 may be tapped for measurement at a location that is physically proximate to a node of interest. This may help to protect on-die signal 104 from IR drop and/or capacitive effects.

For example, on-die measurement circuit 102 may be positioned physically proximate to the node of interest. Alternatively, or additionally, die 100 may further include an analog buffer to tap on-die signal 104 at a location proximate to the node of interest, and to provide a buffered version of on-die signal 104 to measurement circuit 102. The analog buffer may substantially isolate other circuitry that uses on-die signal 104, referred to herein as functional path circuitry, from potential noise and/or other potential effects related to measurement circuit 102. The analog buffer may include a unity-gain analog buffer (UGB), and may be implemented within measurement circuit 102.

On-die measurement circuit 102 may be configured to generate indication 108 from a voltage and/or current source other than on-die signal 104. This may help to protect on-die signal 104 from IR drops and/or capacitive effects.

On-die measurement circuit 102 may be configured to generate indication 108 as one of first and second voltage levels, such as to indicate whether a measure of on-die signal 104 is less-than or greater-than a measure of off-die reference signal 106. This may render indication 108 substantially insensitive to amplitudes of on-die signal 104 and off-die generated reference signal 106, and to potential IR drop between on-die measurement circuit 102 and pad 110.

On-die measurement circuit 102 may be further configured to generate indication 108 from a voltage source that is greater than a voltage of on-die signal 104, such as a system reference voltage, and to provide a voltage swing between the first and second voltage levels that is greater than the voltage of on-die signal 104.

On-die measurement circuit 102 may be useful to measure voltages during testing and/or debugging of an IC. For example, and without limitation, on-die measurement circuit 102 may be useful in debugging of input/output (I/O) circuits, such as to measure bandgap reference voltage levels, bias voltage levels, and/or other reference and/or control voltages. As another example, on-die measurement circuit 102 may be used to characterize circuits that generate reference and/or control voltages, such as voltage divider circuits and bias generation circuits. On-die measurement circuit 102 is not, however, limited to testing and debugging, and may be implemented to measure on-die signal 104 after die is deployed for operation.

On-die measurement circuit 102 may provide relatively accurate measurement of on-die signal 104 without subjecting on-die signal 106 to potential adverse effects of off-die measurement techniques.

Figure 2:
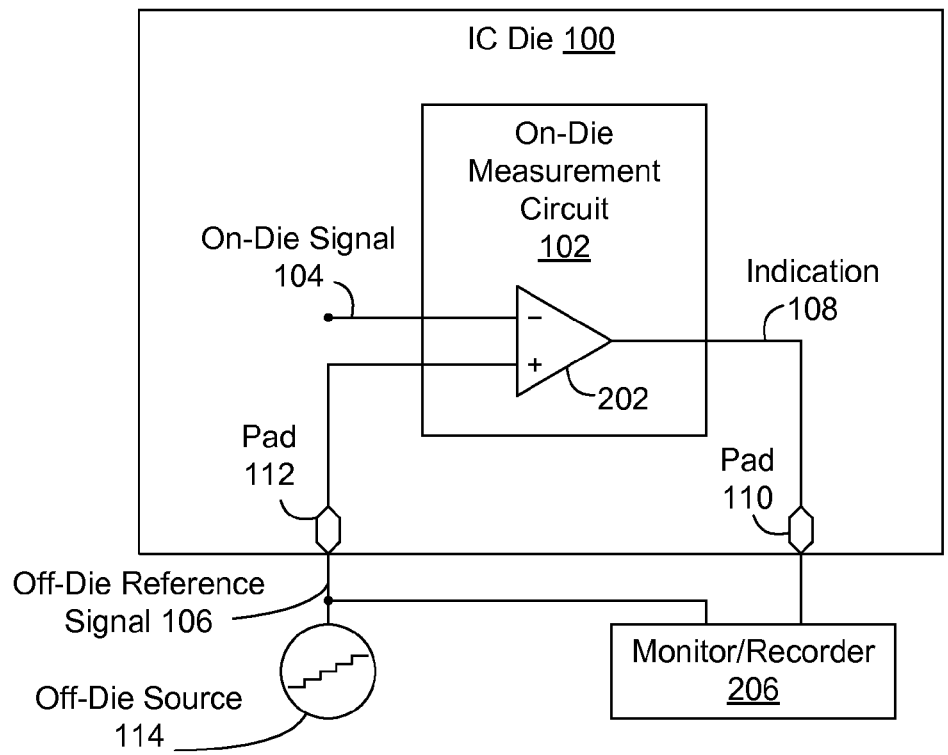
FIG. 2 is a block diagram of the die of FIG. 1, wherein the on-die measurement circuit includes is configured to generate an indication of whether a feature of the on-die signal is less-than or greater-than a corresponding feature of the off-die reference signal.

FIG. 2 is a block diagram of die 100, wherein on-die measurement circuit 102 includes a comparator 202 to compare on-die signal 104 to off-die reference signal 106, and to generate indication 108 as an indication of whether a feature of on-die signal 104 is less-than or greater-than a corresponding feature of off-die reference signal 106.

Comparator 202 may be configured to continuously compare on-die signal 104 to off-die reference signal 106.

Off-die source 114 may be configured to vary off-die reference signal 106, and comparator 202 may be configured to change a state of indication 108 when a measure of off-die reference signal 106 exceeds a corresponding measure of on-die signal 104.

Comparator 202 may include a voltage comparator to compare voltage levels of on-die signal 104 and off-die reference signal 106, and may be configured to compare analog, or direct current voltage levels. Comparator 202 is not, however, limited to a voltage comparator.

Comparator 202 may be configured to compare direct current, or analog voltage levels of on-die signal 104 and off-die reference signal 106.

Off-die signal source 114 may be powered independently of die 100, and may include a relatively high-current-drive voltage source. This may help to overcome potential IR drop between source 114 and measurement circuit 102, which may help to ensure measurement accuracy. Off-die signal source 114 is not, however, limited to a voltage source.

Off-die signal source 114 may be programmable or otherwise configured to generate reference signal 106 as a series of changing reference voltage levels, which may include a sequence of incrementally increasing voltage steps, referred to herein as stepped voltage levels or a stepped voltage.

The sequence of stepped voltage levels may begin with a voltage level that is less than a voltage level of on-die signal 104, and may incrementally increase to a voltage level that is greater than that of on-die signal 104. Off-die Source 114 may be configured to incrementally increase the voltage level of off-die reference signal 106 to a system voltage level of die 100, or until the voltage level of off-die reference signal 106 exceeds the voltage level of on-die signal 104.

Comparator 202 may include n-type and/or p-type devices, which may include one or more n-type and/or p-type metal-oxide semiconductor field effect transistors (MOSFET). Selection of n-type and/or p-type devices may be based, at least in part, on relative signal levels encountered by on-die measurement circuit 102. For example, where a voltage of on-die signal 104 is relatively small compared to a system reference voltage level, p-type devices may be more suitable to measure on-die signal 104. Where a voltage of on-die signal 104 is relatively large compared to the system reference voltage level, p-type devices may be more suitable to measure on-die signal 104. Comparator may include multiple selectable comparators to compare for different voltage levels of on-die signal 104.

Comparator 202 may be further configured to generate indication 108 from a voltage signal other than on-die signal 104, such as a system reference voltage, and with a voltage swing defined by and/or substantially equal to the system reference voltage, such as disclosed below with reference to FIG. 3.

Figure 3:
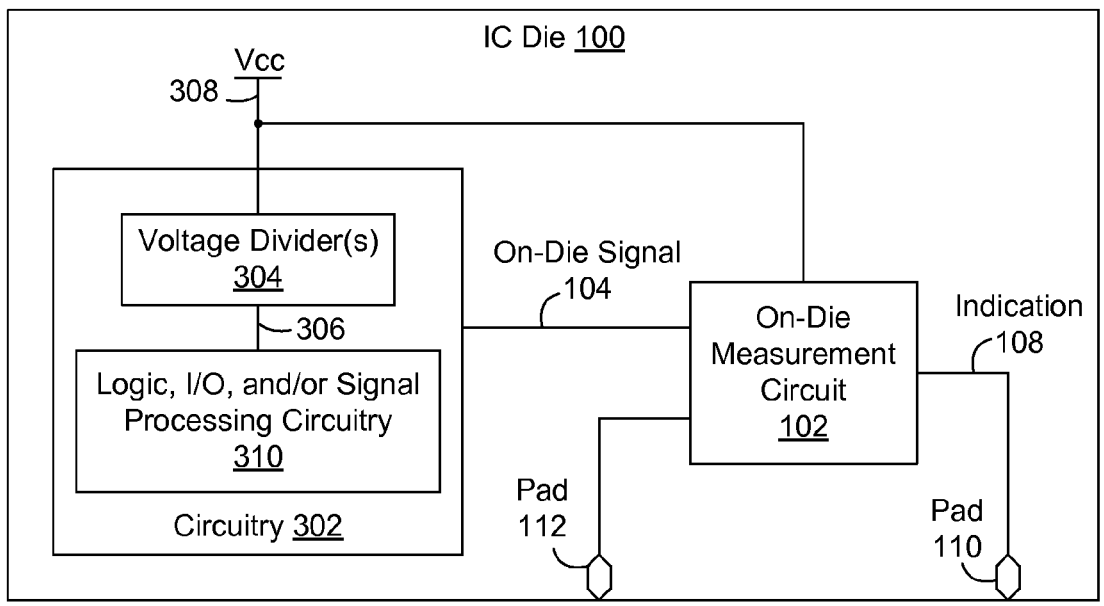
FIG. 3 is a block diagram of the die of FIG. 1, further including on-die circuitry from which the on-die signal may be measured.

FIG. 3 is a block diagram of die 100, further including on-die circuitry 302. On-die circuitry 302 may include one or more voltage dividers 304 to generate one or more reference voltages 306 from a system reference voltage Vcc 308. System reference voltage Vcc 308 may be received from an off-die source.

On-die circuitry 302 may include circuitry 310, which may include one or more of logic, input/output (I/O) circuitry, and/or signal processing circuitry, and which may receive one or more reference voltages 316 and/or system reference voltage Vcc 308.

On-die signal 104 may correspond to one or more signals within circuitry 302, and may include one or more reference voltages 306 and/or one or more signals within circuitry 310.

On-die measurement circuit 102 may be configured to generate indication 108 from system reference voltage Vcc 308, with a voltage swing substantially equal to system reference voltage Vcc 308. For example, where on-die measurement circuit 102 is configured to generate indication 108 as one of two voltage levels, such as disclosed above with reference to FIG. 2, on-die measurement circuit 102 may be further configured to generate the first and second voltage levels voltage levels with a voltage swing that is substantially equal to system reference voltage Vcc 308.

Die 100 may include one or more buffer or driver circuits to drive indication 108 to pad 110.

On-die measurement circuit 102 may configured to measure a plurality of on-die signals, such as disclosed below with reference to FIG. 4.

Figure 4:
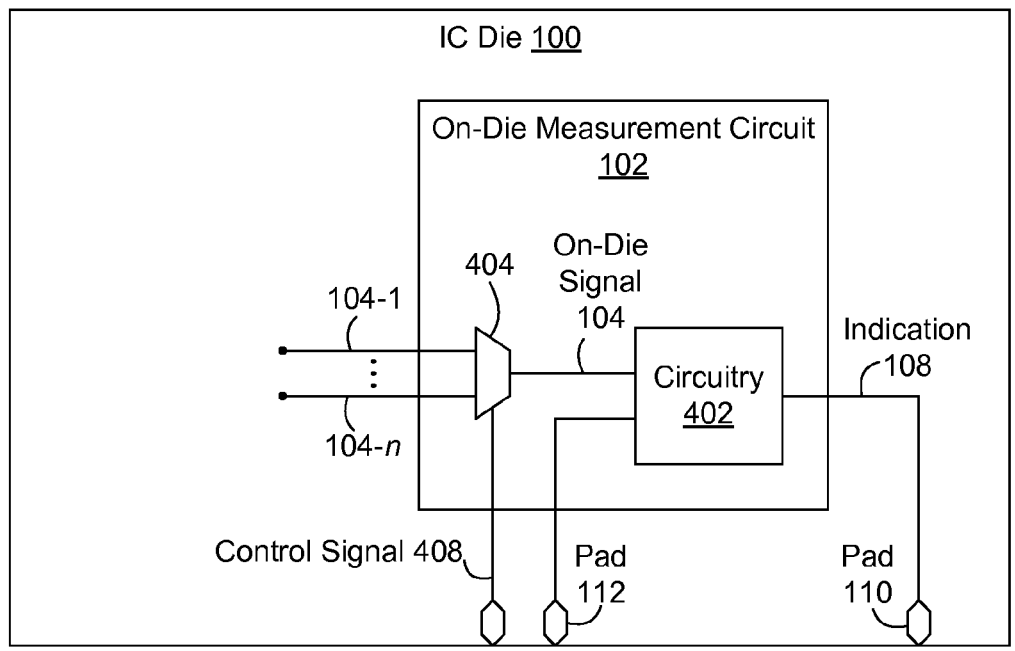
FIG. 4 is a block diagram of the die of FIG. 1, wherein the on-die measurement circuit is configured to measure a plurality of on-die signals.

FIG. 4 is a block diagram of IC die 100, wherein on-die measurement circuit 102 includes measurement circuitry 402 and an input multiplexer 404 selectively provide a plurality of on-die signals 104-1 through 104-N to measurement circuitry 402 under control of a control signal 408. Control signal 408 may be received from on off-die source, which may be controlled manually and/or programmably.

Measurement circuitry 406 may include a comparator, such as disclosed above with reference to FIG. 2, and may include circuitry 302 or portions thereof, such as disclosed above with reference to FIG. 3.

An IC die may include multiple on-die measurement circuits, such as disclosed below with reference to FIG. 5. Multiple on-die measurement circuits, or a portion thereof, may be configured similarly to one another. Alternatively, or additionally, multiple on-die measurement circuits, or a portion thereof, may be configured differently from one another.

Figure 5:
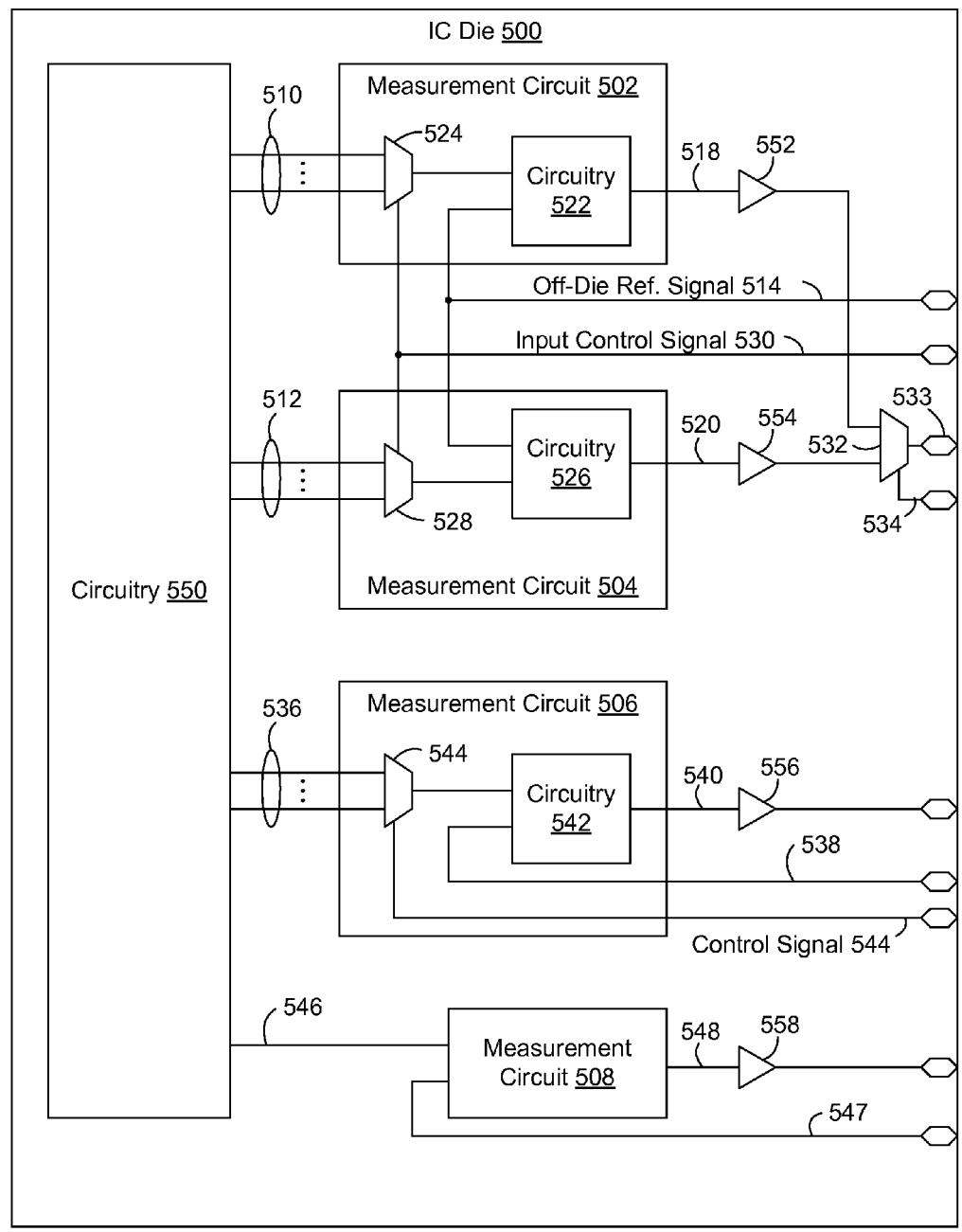
FIG. 5 is a block diagram of another IC die, including a plurality of on-die measurement circuits, each to measure a corresponding set of one or more on-die signals.

FIG. 5 is a block diagram of an IC die 500, including a plurality of on-die measurement circuits 502, 504, 506, and 508.

On-die measurement circuits 502 and 504 are each illustrated to measure a plurality of corresponding on-die signals 510 and 512 relative to an off-die generated reference signal 514, and to generate corresponding indications 518 and 520, such as disclosed with respect to one or more examples herein.

Measurement circuit 502 includes measurement circuitry 522 and a multiplexer 524 to selectively provide on-die signals 510 to measurement circuitry 522.

Measurement circuit 504 includes measurement circuitry 526 and a multiplexer 528 to selectively provide on-die signals 512 to measurement circuitry 526.

In the example of FIG. 5, multiplexers 524 and 528 are controlled by a shared input control signal 530, which may be generated off-die. Alternatively, multiplexers 524 and 528 may be controlled by separate input control signals.

IC 500 further includes an output multiplexer 532 to selectively output indications 518 and 520 to a shared pad 533 under control of an output control signal 534, which may be generated off-die.

An off-die system may be configured to correlate multiplexed indications 518 and 520 at pad 533 with respective measurement circuits 502 and 504, based on input control signal 534, and to an on-die signal within on-die signals 510 and 512 based on input control signal 530.

Measurement circuit 506 is illustrated to measure a plurality of on-die signals 536 relative to an off-die reference signal 538, and to generate a measurement indication 540, such as disclosed above with reference to FIG. 4. Measurement circuit 506 includes measurement circuitry 542 and a multiplexer 544 to selectively provide on-die signals 536 to measurement circuitry 542 under control of an input control signal 544.

Measurement circuit 508 is illustrated to measure an on-die signal 546 relative to an off-die reference signal 547, and to generate a measurement indication 548, such as disclosed with respect to one or more examples herein.

Die 500 further includes circuitry 550, from which on-die signals 512, 512, 536, and 546 are received by measurement circuits 504, 504, 506, and 508. Circuitry 550 may include circuitry such as disclosed with respect to one or more examples herein.

On-die measurement circuits 504, 504, 506, and 508 may each be located physically proximate to portions of circuitry 550 from which corresponding on-die signals 512, 512, 536, and 546 are tapped for measurement. This may reduce or avoid IR drop between the tap locations and the measurement circuits.

Measurement indications 518, 520, 540, and 548 may be generated relative to a system reference voltage, such as disclosed above with reference to FIG. 3, and or may be buffered with one or more buffers 552, 554, 556, and 558, as illustrated in FIG. 5.

On or more of on-die measurement circuits 504, 504, 506, and 508 may include a comparator, such as disclosed above with reference to FIG. 3. On-die measurement circuits 504, 504, 506, and 508 are not, however, limited to comparators.

Methods of measuring a signal on an integrated circuit die are disclosed below with reference to FIGS. 6 through 9.

Figure 6:
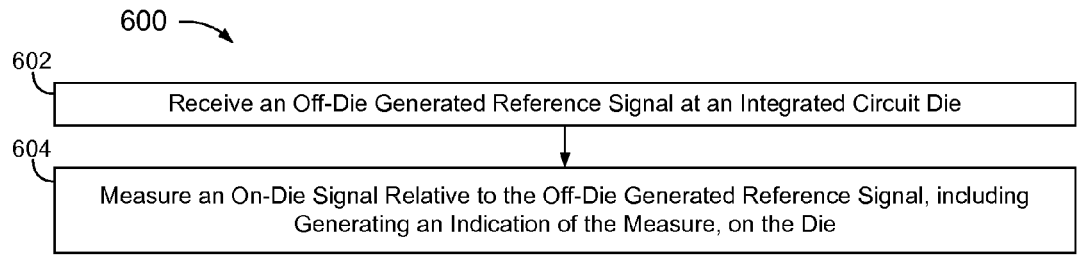
FIG. 6 is a flowchart of a method of measuring a signal on an integrated circuit die.

FIG. 6 is a flowchart of a method 600 of measuring a signal on an integrated circuit die.

At 602, an off-die generated reference signal is received at an integrated circuit die. The reference signal may include a series of increasing analog voltage steps, such as disclosed in one or more examples above.

At 604, an on-die signal is measured relative to the off-die generated reference signal, on the die. The measuring may include generating an indication of the measurement. The measuring may include measuring an analog voltage, such as disclosed below with reference to FIG. 7

Figure 7:
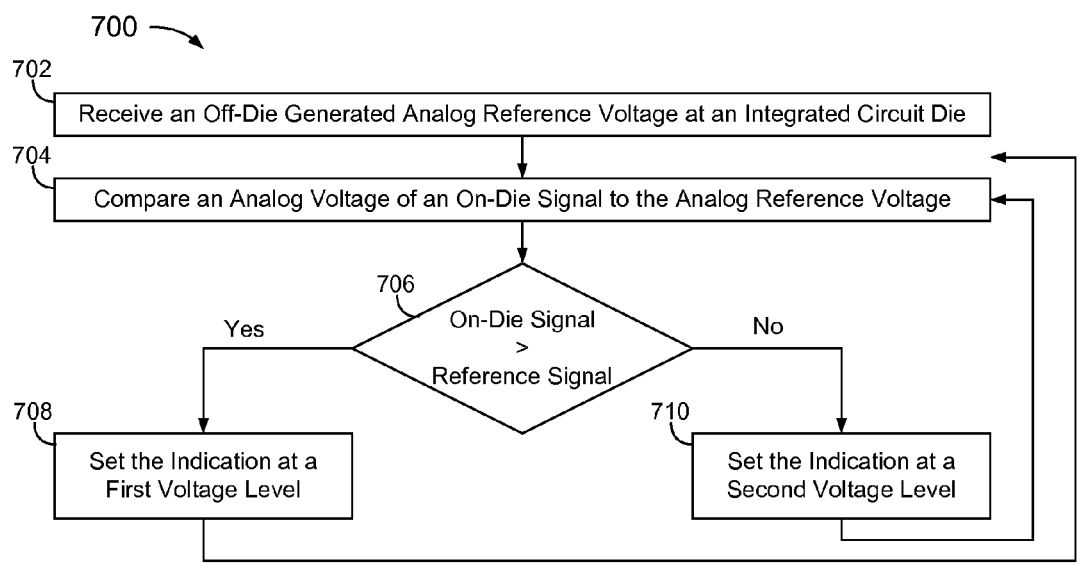
FIG. 7 is a flowchart of a method of measuring an analog voltage on an integrated circuit die.

FIG. 7 is a flowchart of a method 700 of measuring an analog voltage of a signal on an integrated circuit die.

At 702, an off-die generated reference voltage is received at an integrated circuit die. The reference voltage may include a series of increasing analog voltage steps, such as disclosed in one or more examples above.

At 704, an analog voltage of an on-die signal is compared to analog reference voltage, on the die.

At 706, when the on-die signal voltage is greater than the reference voltage, an indication is set to a first voltage at 708. When the off-die reference voltage is greater than the on-die signal voltage, the indication is set to a second voltage at 710.

The measuring may be performed continuously as illustrated by arrows directed from 708 and 710 to 704. During continuous measuring, the analog reference voltage may increase incrementally, such as disclosed in one or more examples above, and the indication may change from the first voltage level to the second voltage level when the reference voltage exceeds the on-die signal voltage.

The indication may be provided to an off-die accessible pad of the IC, such as to permit monitoring of the indication.

Figure 8:
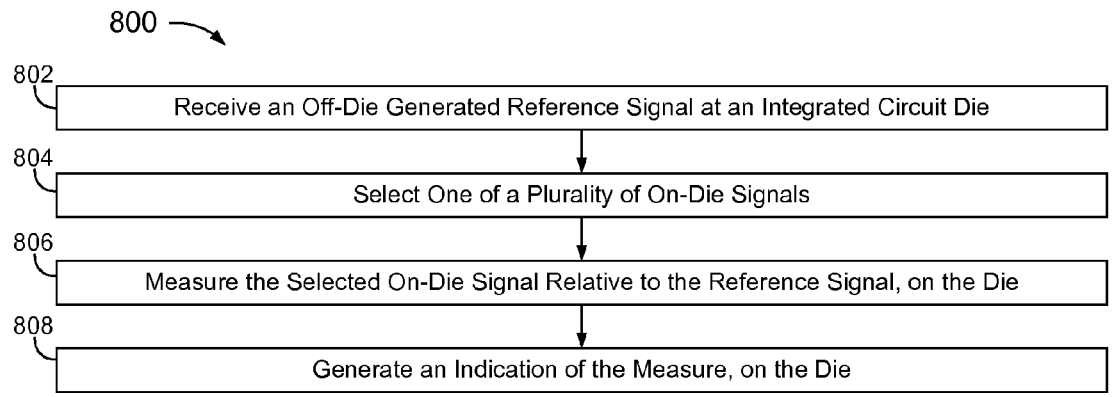
FIG. 8 is a flowchart of a method of measuring a plurality of signals on an integrated circuit die.

FIG. 8 is a flowchart of a method 800 of measuring a plurality of signals on an integrated circuit die.

At 802, an off-die generated reference signal is received at an integrated circuit die, such as disclosed in one or more examples above.

At 804, one of a plurality of on-die signals is selected. The selecting may include multiplexing one of the plurality of on-die signals to a measurement circuit under control of a control signal. The control signal may be received from an off-die source.

At 806, the selected on-die signal is measured with reference to the off-die generated reference signal, such as disclosed in one or more examples above.

At 808, an indication of the measurement is generated, such as disclosed in one or more examples above.

Figure 9:
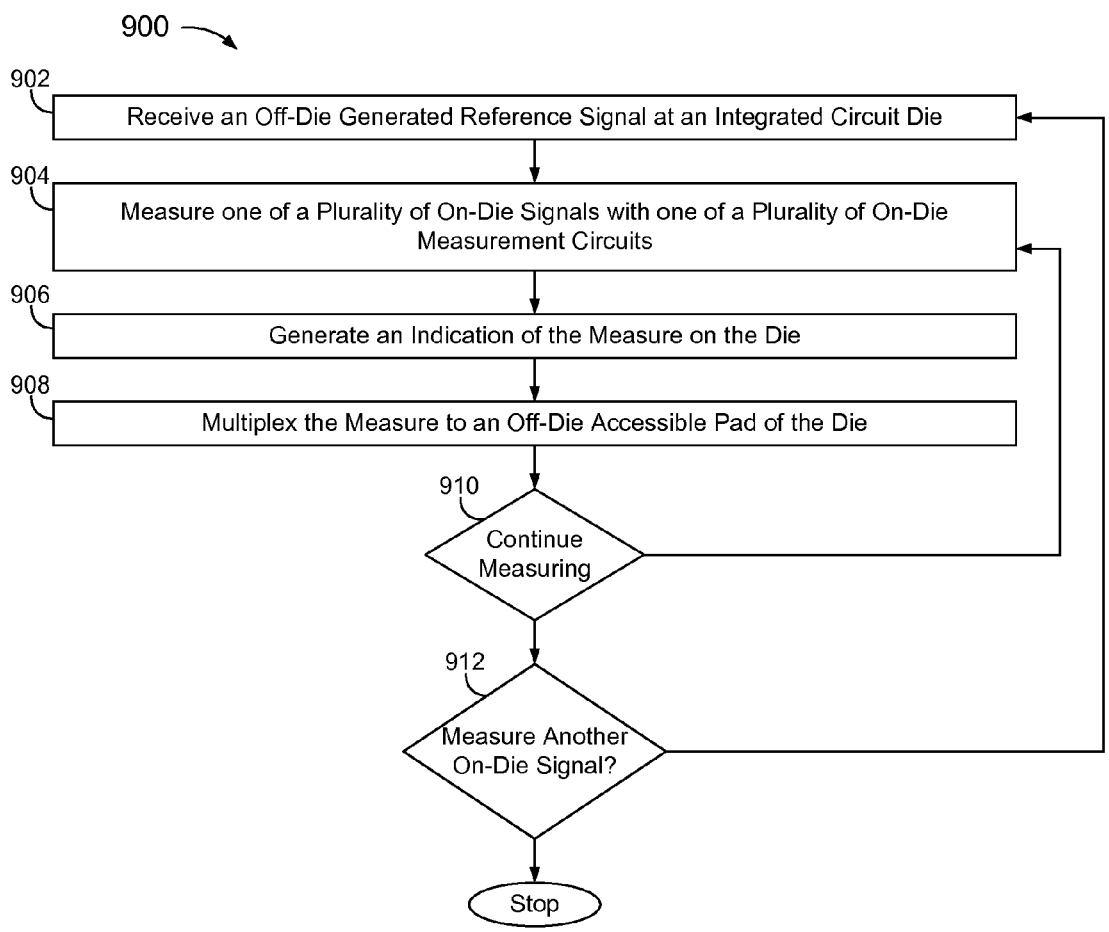
FIG. 9 is a flowchart of a method of measuring plurality of sets of one or more signals on an integrated circuit die.

FIG. 9 is a flowchart of a method 900 of measuring a plurality of sets of on-die signals with corresponding on-die measurement circuits.

At 902, an off-die generated reference signal is received at an integrated circuit die, such as disclosed in one or more examples above.

At 904, one of a plurality on-die signals is measured relative to the reference signal, by one of a plurality of on-die measurement circuits, such as disclosed in one or more examples above. The on-die signal may be selected from a plurality of on-die signals, such as disclosed above with reference to FIG. 8.

At 906, an indication of the measure is generated, such as disclosed in one or more examples above.

At 908, the measure is multiplexed to an off-die accessible pad of the die.

At 910, the measuring, generating, and multiplexing at 904, 906, and 908 may be performed continuously with respect to the on-die signal and the measurement circuit, such as to measure the on-die signal with respect to a series of increasing voltage steps of the reference signal.

The measuring, generating, and multiplexing at 904, 906, and 908 may be halted with respect to the on-die signal and the measurement circuit at 910, such as when a voltage of the reference signal exceeds a voltage of the on-die signal.

At 912, when another on-die signal is to be measured, processing returns to 902. At this point, the off-die generated reference signal may be reset to an initial value, such as an initial voltage, and the measuring, generating, and multiplexing at 904, 906, and 908 may be performed continuously for the other on-die signal until halted. The other signal may be measured with the same measurement circuit as a prior iteration or another measurement circuit.

The multiplexing at 908 may permit indications from the plurality of on-die measurement circuits to be output to a shared pin of the die.

Figure 10:
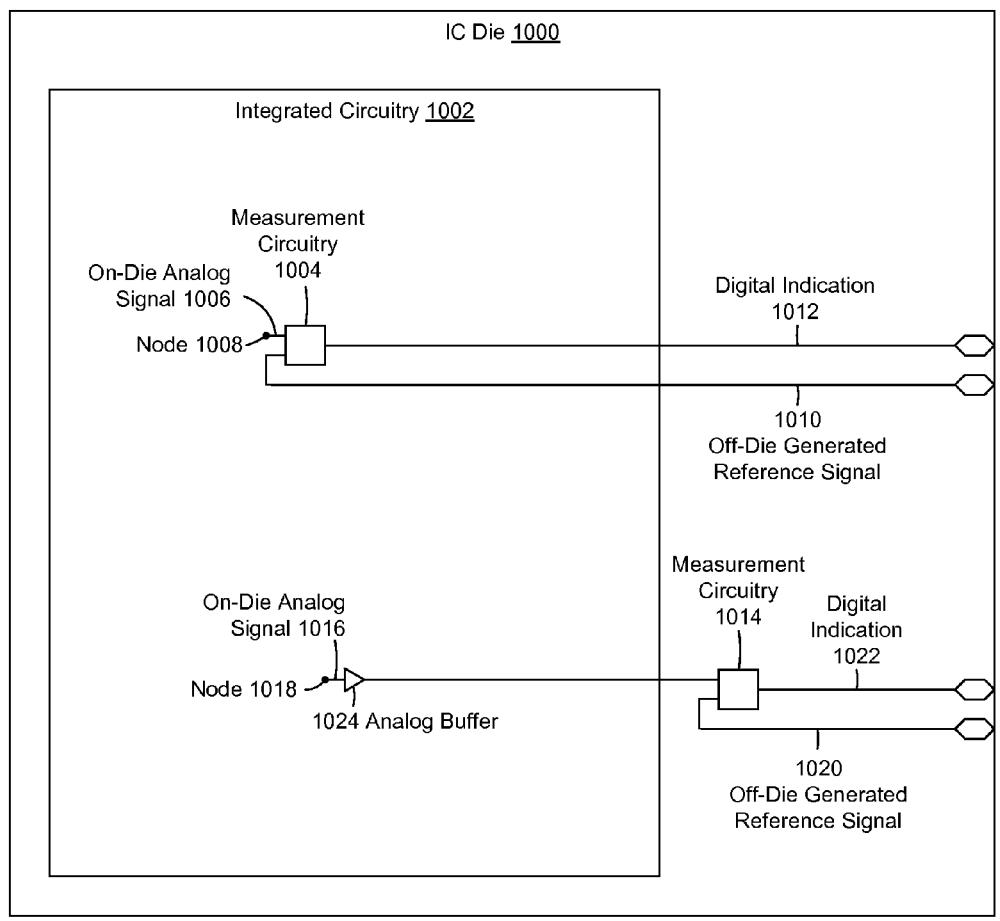
FIG. 10 is a block diagram of another IC die, including first and second measurement circuitry.

FIG. 10 is a block diagram of an IC die 1000, including integrated circuitry 1002 and first and second measurement circuitry 1004 and 1014 to measure analog signals of nodes within integrated circuitry 1002.

First measurement circuitry 1004 is configured to measure an on-die analog signal 1006 of a node 1008 of integrated circuitry 1002 relative to an off-die generated reference signal 1010, and to generate a digital indication 1012 of the measure, such as described in one or more examples herein. In FIG. 10, first measurement circuitry 1004 is positioned adjacent to node 1008 to limit IR loading and capacitive effects as described further above.

Second measurement circuitry 1014 is configured to measure an on-die analog signal 1016 of a node 1018 of integrated circuitry 1002 relative to an off-die generated reference signal 1020, and to generate a digital indication 1022 of the measure, such as described in one or more examples herein.

In FIG. 10, IC die 1000 includes an analog buffer 1024 to buffer on-die analog signal 1016 at or adjacent to node 1018 to limit IR loading and capacitive effects as described further above. Analog buffer 1024 may be a unity gain analog buffer as described further above.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example embodiments disclosed herein.

What is claimed is:

1. An apparatus, comprising an integrated circuit (IC) die, wherein the IC die includes:
    integrated circuitry;
    a first off-die accessible pad to receive an off-die generated reference signal; and
    a measurement circuit that includes measurement circuitry to measure an on-die analog signal of a node of interest within the integrated circuitry relative to the off-die generated reference signal, and to generate a digital indication of the measure on the IC die;
    wherein the measurement circuit is configured to protect the node of interest from current/resistive (IR) loading and capacitive effects of one or more of the measurement circuit and a connection between the node of interest and the measurement circuit.

2. The apparatus of claim 1, wherein the measurement circuitry is positioned adjacent to the node of interest within the integrated circuitry to limit the IR loading and capacitive effects.

3. The apparatus of claim 1, wherein the measurement circuit includes an analog buffer to buffer the on-die analog signal and provide the buffered on-die analog signal to the measurement circuitry, and wherein the analog buffer is positioned adjacent to the node of interest within the integrated circuitry to limit the IR loading and capacitive effects.

4. The apparatus of claim 3, wherein the analog buffer includes a unity gain analog buffer.

5. The apparatus of claim 1, wherein the measurement circuitry includes:
    an analog voltage comparator configured to continuously compare a voltage of the on-die analog signal to a voltage of the off-die generated reference signal and to change a state of the digital indication when the voltage of the off-die generated reference signal exceeds the voltage of the on-die analog signal.

6. The apparatus of claim 1, wherein the measurement circuitry includes
    an analog voltage comparator to compare a voltage of the on-die analog signal to a voltage of the off-die generated reference signal;
    wherein the analog voltage comparator is configured to receive power from an on-die system reference voltage.

7. The apparatus of claim 1, wherein the measurement circuitry includes:
    an analog voltage comparator to compare a voltage of the on-die analog signal to a voltage of the off-die generated reference signal;
    wherein the analog voltage comparator includes one of p-type devices and n-type devices to measure the on-die analog signal based on an extent of a difference between a voltage of the on-die analog signal and the system reference voltage.

8. The apparatus of claim 1, wherein the measurement circuitry is configured to receive power from a source other than the on-die analog signal of the node of interest.

9. The apparatus of claim 1, wherein the measurement circuit further includes:
    an input multiplexer to receive multiple on-die signals from multiple nodes of interest of the integrated circuitry, and to provide selectable ones of the multiple on-die signals to the measurement circuitry.

10. The apparatus of claim 1, wherein the IC die further includes:
    a multiple instances of the measurement circuit, each to measure an on-die analog signal of a corresponding node of interest within the integrated circuitry; and
    an output multiplexer to provide outputs of selectable ones of the measurement circuits to a second externally accessible pad of the IC die.

11. The apparatus of claim 1, further including:
    an off-die voltage source to provide the off-die generated reference signal as a sequence of incremental voltage steps;
    wherein the measurement circuitry includes an analog voltage comparator to compare a voltage of the on-die analog signal to a voltage of the off-die generated reference signal, and to change a state of the digital indication when the voltage of the off-die generated analog signal exceeds the voltage of the on-die signal.

12. The apparatus of claim 1, further including:
    a high-current drive off-die signal generator to provide the off-die generated reference signal with high-current drive to limit IR loading between the off-die signal generator and the measurement circuit.

13. The apparatus of claim 1, wherein the integrated circuitry includes input/output (I/O) circuitry, and wherein the measurement circuitry is configured to measure an on-die bandgap reference voltage of the I/O circuitry at the node of interest.

14. The apparatus of claim 1, wherein the integrated circuitry includes input/output (I/O) circuitry, and wherein the measurement circuitry is configured to measure a bias voltage of the I/O circuitry at the node of interest.

15. The apparatus of claim 1, wherein the integrated circuitry includes input/output (I/O) circuitry, and wherein the measurement circuitry is configured to measure a control voltage of the I/O circuitry at the node of interest.

16. The apparatus of claim 1, wherein the measurement circuit is configured to measure the on-die analog signal as part of a circuit characterization procedure.

17. The apparatus of claim 1, wherein the measurement circuit is configured to measure the on-die analog signal after the IC die is deployed in operation.

18. An apparatus, comprising an integrated circuit (IC) die, wherein the IC die includes:
   integrated circuitry;
   a first off-die accessible pad to receive an off-die generated analog signal; and
   a measurement circuit that includes measurement circuitry to measure an on-die analog signal of a node of interest within the integrated circuitry relative to the off-die generated reference signal, and to generate a digital indication of the measure on the IC die;
wherein the measurement circuit is configured to protect the node of interest from current/resistive (IR) loading and capacitive effects of one or more of the measurement circuit and a connection between the node of interest and the measurement circuit;
wherein the measurement circuitry includes a first analog voltage comparator configured with p-type devices and a second analog voltage comparator configured with n-type devices;
wherein the first and second analog voltage comparators are configured to receive power from an on-die system reference voltage; and
wherein the measurement circuitry is configurable to measure a voltage of the on-die analog signal with a selectable one of the first and second analog voltage comparators based on an extent of a difference between a voltage of the on-die generated analog signal and the on-die system reference voltage.

* * * * *